US005459412A

United States Patent [19]
Mentzer

[11] Patent Number: 5,459,412
[45] Date of Patent: Oct. 17, 1995

[54] BICMOS CIRCUIT FOR TRANSLATION OF ECL LOGIC LEVELS TO MOS LOGIC LEVELS

[75] Inventor: Ray A. Mentzer, Portland, Me.

[73] Assignee: National Semiconductor Corporation, Santa Clara, Calif.

[21] Appl. No.: 86,503

[22] Filed: Jul. 1, 1993

[51] Int. Cl.⁶ ............................................. H03K 19/0175
[52] U.S. Cl. .................................... 326/66; 326/32
[58] Field of Search ........................... 307/475, 446, 307/570, 296.7; 326/66, 110, 32; 327/433, 537

[56] References Cited

U.S. PATENT DOCUMENTS

| | | | |
|---|---|---|---|
| 4,806,799 | 2/1989 | Pelley, III et al. | 307/475 |
| 4,810,908 | 3/1989 | Suzuki et al. | 307/475 |
| 4,864,159 | 9/1989 | Cornelissen | 307/264 |
| 4,943,737 | 7/1990 | Guo et al. | 307/296.7 |
| 4,992,681 | 2/1991 | Urakawa et al. | 307/475 |
| 5,068,551 | 11/1991 | Bosnyak | 307/475 |
| 5,173,624 | 12/1992 | Gabillard et al. | 307/475 |
| 5,187,395 | 2/1993 | Pizer | 307/570 |
| 5,202,594 | 4/1993 | Chang | 307/475 |
| 5,214,328 | 5/1993 | Ohi | 307/475 |
| 5,254,887 | 11/1993 | Oguri | 307/475 |
| 5,317,213 | 5/1994 | Sato et al. | 307/475 |

*Primary Examiner*—Edward P. Westin
*Assistant Examiner*—Benjamin D. Driscoll
*Attorney, Agent, or Firm*—Chris A. Caseiro; Thomas L. Bohan

[57] ABSTRACT

A translator circuit for converting from a first logic-level range to a second logic-level range, as is generally involved in the translation from an ECL stage to a CMOS stage. The translator includes a reference stage that provides a reference voltage that is coupled to the CMOS logic stage as well as the ECL logic stage. The ECL logic stage is indirectly coupled between a high potential power rail and a low potential power rail through a plurality of transistors. The CMOS stage is coupled to the ECL stage through two emitter-follower transistors. The CMOS stage uses current-mirroring techniques in combination with the isolated reference stage to effect a translation from the ECL logic level to the CMOS logic level. The CMOS stage also provides relatively fast propagation time which may be set, within certain limits, to a desired time. The reference stage provides an output signal to the gates of the transistors of the CMOS stage through a bipolar transistor that minimizes impedance and isolates the reference stage from switching noise. Use of the bipolar transistor in the reference stage permits fan out to a plurality of output stages through the use of a single reference stage of the present invention.

7 Claims, 4 Drawing Sheets

BICMOS CIRCUIT FOR TRANSLATION OF ECL LOGIC LEVELS TO MOS LOGIC LEVELS

BACKGROUND OF THE INVENTION

1. Field of the Invention

The present invention relates to a translation circuit for switching between different logic-level swings. In particular, the present invention relates to a translation circuit for switching between the logic levels associated with Emitter-Coupled-Logic (ECL) circuits and the logic levels associated with Complementary Metal-Oxide-Semiconductor (CMOS) circuits. More particularly, the present invention relates to a translation circuit which generates a reference voltage that provides an ECL-to-CMOS logic level transition with minimal delay.

2. Description of the Prior Art

In the rapidly-expanding field of circuits which take advantage of the desirable characteristics of both bipolar transistors and MOS transistors, it is necessary to provide for smooth and fast transition between the different logic-level voltage ranges associated with the two. Specifically, bipolar transistors, which are well-known as having fast switching rates between logic level high and logic level low, also dissipate power to the extent that they cannot be used exclusively in circuit design. MOS transistors, on the other hand, dissipate little power. For that reason, many MOS transistors can be used in a small area with little regard to overheating. However, MOS transistors are much slower than bipolar transistors with regard to switching between logic levels high and low. The difference in switching speeds is related to the difference in logic-level "swings" associated with the two transistor types. Specifically, MOS transistors swing from rail-to-rail voltage levels, while bipolar transistors have logic level swings that are approximately an order of magnitude less.

In order to take advantage of both the fast switching rates of bipolar transistors and the low power consumption of MOS transistors, one often combines the two types on the same chip to form what is commonly known as BiCMOS circuitry. In this combination it is necessary to confront the difference in the logic level swings associated with the two transistor types so as to resolve the problems which this difference causes. Typically, a bipolar transistor externally coupled, i.e., connected to an external power rail, has a swing of only about 0.8 V between logic level high and logic level low, while an internally-coupled bipolar transistor— that is, one not tied directly to the high-potential or the low-potential power rail—can have a logic level swing as low as 200 mV. A digital circuit having a rail-to-rail voltage differential set between 0.0 V and 5.0 V, for example, would have an externally-coupled bipolar transistor responding to a logic high of about 4.1 V and to a logic low of about 3.3 V. On the other hand, a MOS transistor has logic level swings essentially equal to the rail-to-rail voltage differential, or, for the example provided, logic high would be on the order of 5.0 V and logic low on the order of 0.0 V. Further, the greater capacitance associated with MOS transistors increases the time to achieve this switch, as compared to the switching times associated with bipolar transistors. A relatively-fast-switching circuit having bipolar transistors in an ECL design will have propagation delays of only about 100–150 picoseconds (for one gate)—and an average power dissipation of about 22 mW for an output buffer. A MOS-transistor-based circuit will have propagation delays of about 200–400 picoseconds (again for a single gate) but average power dissipation in the microwatt range. In most cases, MOS devices are much more temperature and process dependent, as well as load dependent. ECL devices, however, are much less sensitive to such variations and are load-independent. It is also to be noted that the power dissipation indicated for MOS transistors is frequency-dependent while for ECL it is not. For this reason, it is to be understood that operation of MOS devices at relatively low frequencies results in less power dissipation than the operation of ECL devices, but that is not usually the case at higher frequencies. The "cross-over" point at which one transistor-type is less dissipative than the other involves many factors including the associated load, the size of the device, and fabrication, among others.

When MOS and bipolar transistors are combined to create fast-switching, low-power circuits, certain compatibility problems have to be addressed. I.e., in BiCMOS circuits, bipolar sub-circuits may receive logic signals and then pass on these signals to MOS sub-circuits. The problem is that the logic levels output from a bipolar transistor are generally insufficient to switch a MOS transistor, as can be seen from the respective high-to-low voltage swings noted above. Hence, there must be provided a circuit for converting bipolar logic-level signals to MOS logic-level signals. This can be done in a straightforward fashion utilizing a translator sub-circuit designed to effect that transition. However, such translators inherently introduce delay; that is, it takes time to switch between bipolar and MOS logic levels using such a supplemental sub-circuit. The problem then is to produce a translator which does not cause a significant propagation time increase.

In the field of BiCMOS circuits one particular type of sub-circuit being used with greater frequency is Emitter-Coupled-Logic (ECL). It is well-known that ECL gates are very fast, primarily because the logic level swing is small and because ECL circuits are biased for current-mode operation, thus ensuring that the transistors are not saturated and that there is no storage delay time. ECL circuits are also used in the translators linking the two types of circuitry in BiCMOS circuits. When the ECL component of the circuit is run as a single-ended device, rather than in a differential mode, problems arise due to the voltage fluctuations (due to pick-up) that the high-potential power rails of all circuits are subject to. One result of such sensitivity is the premature switching of the ECL gate. Of course, when the translator is run differentially, fluctuations in absolute voltage levels are of much less concern than the difference in the level swings. In any event, other fluctuations of notable concern are those associated with temperature swings and manufacturing variations from wafer to wafer as well as on the same wafer.

Prior-art ECL-to-CMOS translators have not effectively addressed all of the various problems noted, including propagation delay and sensitivity to power-rail and temperature fluctuations. The prior-art ECL-to-CMOS translator illustrated in FIG. 1 is a logic-level transition amplifier providing translation between a complementary ECL input stage and a MOS output stage, as described in U.S. Pat. No. 4,864,159 issued to Cornelissen on Sep. 5, 1989. The complementary input pair, Q1 and Q2, are emitter-follower transistors providing output signals to PMOS transistors QP1 and QP2 and to PMOS transistors QP3 and QP4. The gates of the noted PMOS transistors are all connected to the gate of PMOS QP5 through NMOS QN5. It is indicated that NMOS QN5 can be used to isolate QP5 from any transients. There are several problems related to the reference stage of the translator illustrated in FIG. 1. Specifically, the use of PMOS QP5 at the reference output provides significant impedance to switching and therefore, in all likelihood slows the propagation rate of the translator. In addition, the high impedance associated with the use of that transistor minimizes the ability to use that single reference stage to fan out to a plurality of output load stages. Also, while it is indicated that NMOS transistor QN5 can be used as an isolation device, the illustrated circuit nevertheless will remain sensitive to switching noises at the gate of QP5. Finally, the prior-art noted fails to address the need to be able to "tune" the propagation delay as desired.

What is needed therefore, is an ECL-to-CMOS translator circuit that provides: (1) isolation from power-rail-voltage fluctuations, temperature fluctuations, and manufacturing-process effects; (2) minimum, selectable propagation delay with effective isolation from switching noise; and (3) the ability to tune the propagation delay through standard fabrication techniques. Further, what is needed is a translator that provides for multiple translation (fan-out) using a single reference stage. Finally, what is needed is a translator that may be utilized in a variety of situations requiring translation including, but not limited to, phase-lock loops and clock recovery circuits.

SUMMARY OF THE INVENTION

It is an object of the present invention to provide a bipolar-to-CMOS translator circuit of simple design with reduced propagation delay and effective isolation from switching noise. It is a further object of the present invention to provide a translator circuit with isolation from power-rail voltage and from temperature fluctuations, as well as from manufacturing variations. It is still a further object of the present invention to provide a translator more general in nature, one that may be tailored to provide a range of propagation delay times for use in an array of circuit types including, but not limited to, phase-lock-loops and clock recovery circuits. It is finally an object of the present invention to provide a translator capable of translation from a bipolar circuit to multiple MOS circuits.

The present invention solves the problems of the prior art through a novel design. The novel ECL-to-CMOS translator is based on (1) isolating the circuit to eliminate its susceptibility to voltage, temperature, and manufacturing fluctuations using a sub-circuit to develop an independent current regulator for the translator, (2) providing a novel sub-circuit reference stage that can be tailored for specific translation and propagation delay requirements; and (3) using a current-mirroring technique so that exact control over the propagation delay may be achieved.

A translator having the features of the present invention includes three stages. The noted sub-circuit reference provides a reference voltage for the output stage of the translator. This reference stage includes a MOS reference transistor having a variable size and current level, and is made using standard fabrication techniques. The MOS reference transistor of the present invention is optimized to minimize the width of the MOS reference transistor consistent with putting out enough current to avoid allowing an ECL circuit to go into saturation, for example. In operation, the reference stage receives an input voltage from an independent, temperature-compensated voltage cell, in a manner similar to that used to isolate the ECL stage of the translator, as will be discussed below. This independent voltage cell reduces the susceptibility of the ECL-to-CMOS translator to commonly known problems caused by temperature and power-rail fluctuations, and by manufacturing-process variations. Generally, this independent voltage cell is located on the same chip as the circuit to be regulated. The reference MOS transistor is in turn coupled to a second reference transistor which outputs a signal to the following sub-circuit of the translator. In order to provide effective isolation from switching noise, and in order to reduce the impedance of the reference stage, thereby enabling the use of a single reference stage for a plurality of output loads, it is preferred that the second reference transistor is a bipolar transistor.

As with all ECL-to-CMOS translators, the ECL stage of the present invention receives an input signal. The ECL stage includes a first input transistor and a second input transistor for receiving a second input signal complementary to the input signal received by the first input transistor, as is well-known, so as to set up a differential, rather than a single-ended, ECL circuit. As with the reference stage, it is desirable, although not absolutely necessary, to isolate ECL differential circuits from power-rail fluctuations, from temperature fluctuations, and from manufacturing variations. This is achieved by coupling the common emitter nodes of the two input transistors to the low-potential power rail through a constant-current "regulator," often known as a constant-current source. The current regulator may be a "tail" transistor, or a tail transistor in combination with a tail resistor. Each of the current regulators for the transistors noted achieves isolation in the circuit because each is a current source providing discharge paths when the voltage level at the particular transistor's control node drops. This is because the current regulator is separately coupled to the temperature-compensation voltage cell noted above. Specifically, the voltage cell is an independent voltage source, $V_{CS}$, that provides base-drive current to the tail transistor. It is well-known that a bandgap voltage generator providing a voltage output of about 1.32 V with respect to GND, and that is stable to within ±20 mV over $V_{CC}$, temperature, and process variations, achieves this purpose. The reference stage can be similarly coupled to GND via its own independently-compensated tail transistor.

In order to complete the translator, a MOS transistor stage of some form is necessary and can be any one of a variety of types that provides output to other circuits "downstream" of the ECL input stage. In the preferred embodiment of the present invention, the MOS transistor stage is a CMOS stage having a first pair of complementary MOS transistors. The gate node of the first PMOS transistor is coupled to the output of the second reference transistor of the reference stage and the source node of the first PMOS transistor is coupled to the emitter node of a first-flow-through transistor of the ECL stage. It is to be noted that in order to provide effective isolation, the first-flow-through transistor is also coupled to GND through its own current-regulating tail transistor sub-circuit. The drain node of the first PMOS transistor is coupled to the gate node of the first NMOS transistor. The drain node and the gate node of the first NMOS transistor are coupled together.

The CMOS stage also has a second pair of MOS transistors. As with the first PMOS transistor, the gate node of the second PMOS transistor is coupled to the output of the second reference transistor. The source node of the second PMOS transistor is coupled to the emitter of a second-flow-through transistor of the ECL stage. The second-flow-through transistor is also isolated as noted. The gate nodes of the first NMOS transistor and the second NMOS transistor are tied together.

Rather than use the complicated circuits associated with the prior art, the present invention uses current-mirroring techniques to facilitate translation. The design of the CMOS stage of the present invention causes current through the first PMOS transistor to move into the first NMOS transistor and to be mirrored to the second NMOS transistor. This mirroring effects translation more simply than the prior art, thereby making translation circuits cheaper and easier to fabricate and to use.

This current-mirroring technique also reduces the propagation delay of the ECL-to-CMOS translator of the present invention. As was mentioned, ECL circuits are very fast-switching, so in attempting to reduce propagation delay, the present invention focuses on reducing the delay caused by MOS transistors. In effect, the current-mirroring technique reduces the number of MOS transistors in operation, thereby reducing propagation delay. The present invention has a further novel and unique characteristic in that by adjusting the size ratios of key transistors the delay time may be set. It is also to be noted that the single reference stage of the present invention can be used to fan-out to a plurality of output stages. In addition, the translator of the present invention may be used in a phase-lock-loop circuit, as well as in a clock recovery circuit, wherein the MOS reference transistor is coupled through a tail transistor to a loop filter instead of to the independent voltage source. In this way, the tail transistor current is modulated as a function of variations in the frequency of the loop filter. The modulation in the tail transistor thus provides tuning of the propagation delay in the reference stage.

These novel features and others will become apparent upon review of the detailed description of the preferred embodiment and the appended claims.

DETAILED DESCRIPTION OF THE PREFERRED EMBODIMENT OF THE PRESENT INVENTION

Figure 1:
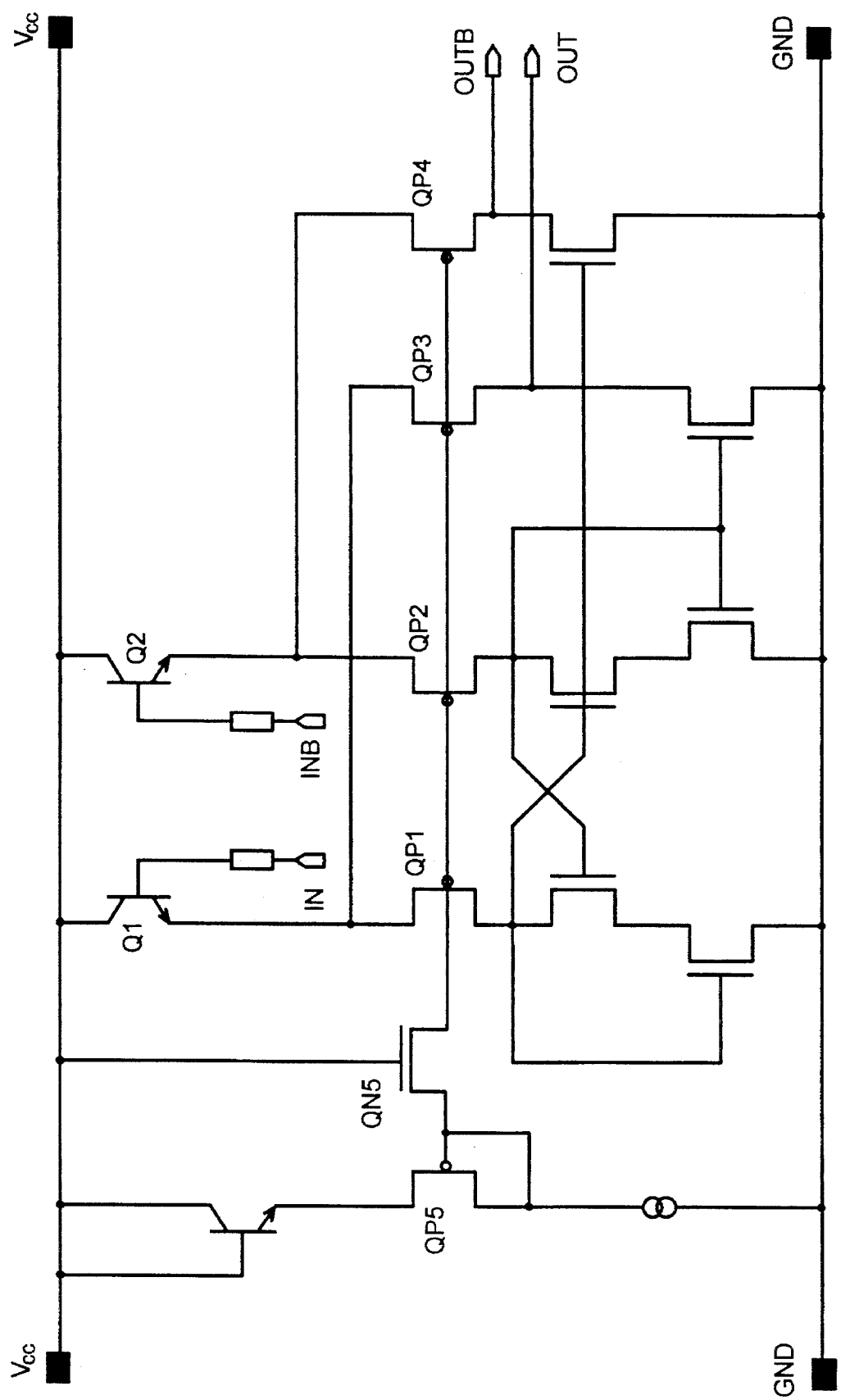
FIG. 1 is a schematic diagram of an ECL-to-CMOS translator of the prior art.
Figure 2:
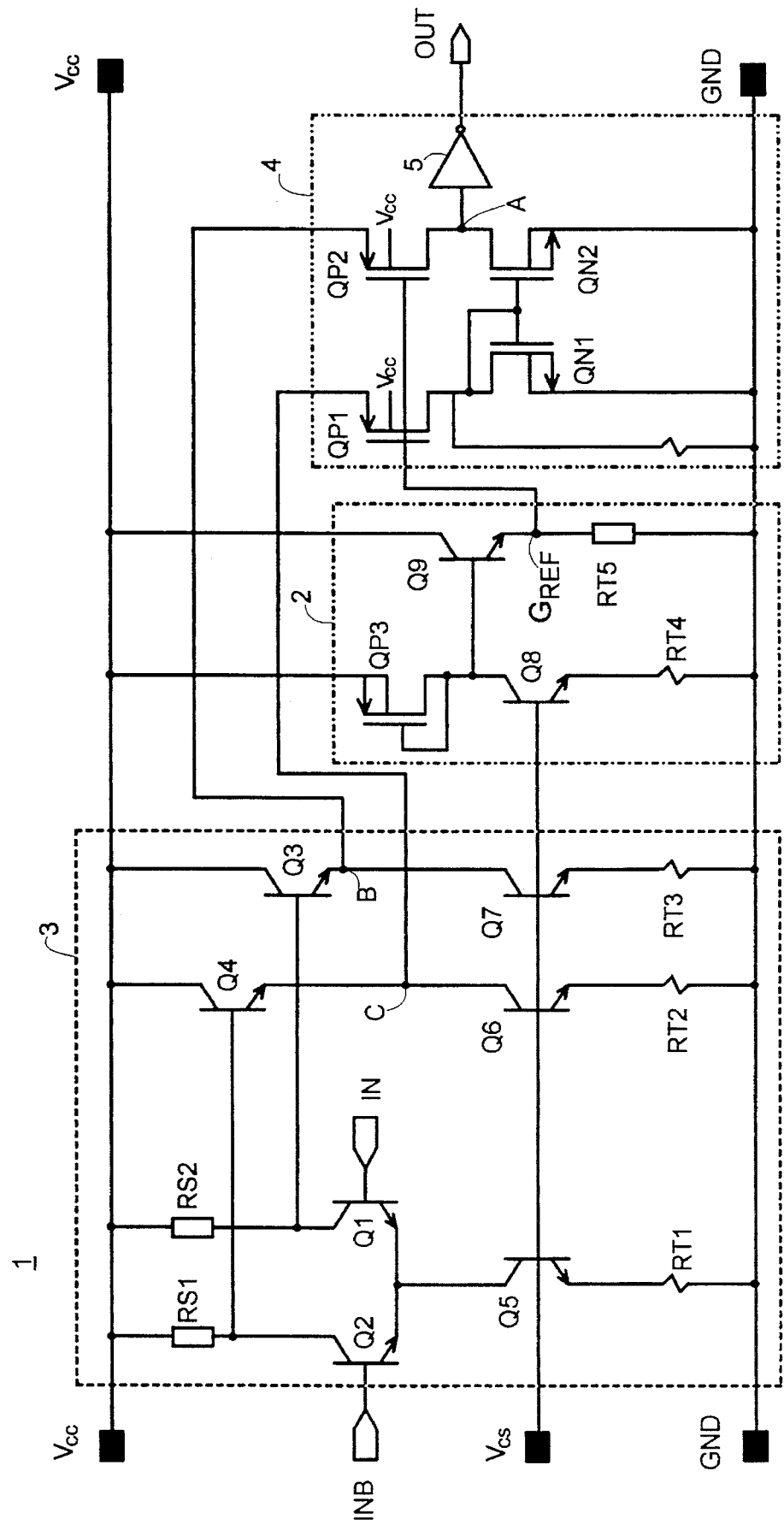
FIG. 2 is a schematic diagram of the ECL-to-CMOS translator of the present invention.

The device of the present invention, an ECL-to-CMOS translator 1, is illustrated in FIG. 2 and includes a reference-voltage stage 2 for developing an independent voltage reference source for the ECL-to-CMOS transition. It is to be understood that the translator circuit described herein may be used in phase-lock-loop circuits, clock recovery circuits, or in other circuit designs in which rapid transitions are desired. With reference to FIG. 2, an ECL input stage 3 of the ECL-to-CMOS translator 1 includes a first input transistor Q1 and a second input transistor Q2, wherein the first input transistor Q1 receives a first input signal IN at its control node and the second input transistor Q2 receives a second input signal INB at its control node, with the second input signal INB being the complement of the first input signal IN. Preferably, Q1 and Q2 are coupled to high-potential power rail $V_{CC}$ through swing resistors RS1 and RS2, respectively.

Further included as part of the bipolar-ECL-input stage 3 are a first emitter-follower-transistor Q3 and a second emitter-follower-transistor Q4, wherein a control node of the first emitter-follower-transistor Q3 is coupled to a collector node of the first input transistor Q1 and a control node of the second emitter-follower-transistor Q4 is coupled to a collector node of the second input transistor Q2. Also included in the bipolar-ECL-input stage 3 is first tail transistor Q5, wherein an emitter node of Q5 is coupled to low-potential power rail GND through first tail resistor RT1, and wherein a collector node of Q5 is coupled to the emitter node of Q1 and the emitter node of Q2. Q5, in conjunction with RT1, acts as a current regulator for the complementary input transistor pair Q1 and Q2. It is to be noted that first emitter-follower-transistor Q3 is also coupled to low-potential power rail GND through a second current regulator, Q7,RT3, and that second emitter-follower-transistor Q4 is coupled to GND through a third current regulator, Q6,RT2.

In furtherance of the goal of providing effective isolation to the ECL-to-CMOS translator 1 of the present invention, the control node of Q5 is coupled to a separate bandgap reference voltage source, identified as $V_{CS}$. This separate reference voltage cell acts to keep Q5—and any other tail transistor to which it is coupled, such as Q6 and/or Q7—on, and provides compensation to the input transistors Q1 and Q2 whenever temperature or power-rail fluctuations affect voltage levels of the various components of the ECL-to-CMOS translator 1. As illustrated in FIG. 2, Q3 and Q4 are also linked to the bandgap reference source which may be any type of well-known bandgap voltage generator such as, for example, a Widler cell.

In operation, the emitter-follower stages incorporating transistors Q3 and Q4 provide a shift in the voltage level from transistors Q1 and Q2, respectively, to a CMOS-output stage 4 of the ECL-to-CMOS translator 1, a voltage shift sufficient to make the ECL output commensurate with the CMOS input requirement. In the circuit illustrated in FIG. 2, the CMOS-output stage includes a first complementary pair of transistors, QP1 and QN1—wherein the source of first PMOS transistor QP1 is coupled to the output of the second emitter-follower transistor Q4, and a second complementary pair of transistors, QP2 and QN2—wherein the source of the second PMOS transistor QP2 is coupled to the output of the first emitter-follower transistor Q3. Of course, as with most CMOS transistor pairs, the drain nodes of transistors QP1 and QN1 are coupled together, as are the drain nodes of transistors QP2 and QN2.

The signals provided by emitter-follower-transistors Q3 and Q4 to the source nodes of second PMOS transistor QP2 and first PMOS transistor QP1, respectively, are dependent upon the voltage level of high-potential power rail $V_{CC}$ and the swing between logic-high (H) and logic-low (L) inputs at transistors Q1 and Q2. For example, with H at IN, input INB is at L, Q1 is on, Q2 is off, and so a control node of Q4 is essentially at voltage level $V_{CC}$, and a control node of Q3 is essentially at voltage level $V_{CC}$ minus the voltage differential between H and L (provided by the drop across RS2). For standard externally-coupled bipolar transistors, this voltage differential, $V_{SWING}$, is generally set to be about 0.8 V, and for internally-coupled bipolar transistors it is about 200 mV. Of course, this will depend on the tail current established by Q5. Therefore, at H, the control node of externally-coupled transistor Q3 is at a voltage of about $V_{CC}$–0.8 V. Continuing with this example for the circuit illustrated in FIG. 2, the voltage level at the source node of first PMOS transistor QP1 will be $V_{CC}$ minus the voltage drop from the base-to-emitter of second emitter-follower transistor Q4, identified as voltage drop $V_{BEQ4}$, while the source node of second PMOS transistor QP2 will be at a voltage level equal to $V_{CC}-V_{SWING}$ minus the voltage drop from the base-to-emitter of first emitter-follower transistor Q3, identified as voltage drop $V_{BEQ3}$. Thus, the "swing" will remain the same, just the absolute value of both voltages will be reduced by $V_{BEQ3}$, assuming $V_{BEQ3}=V_{BEQ4}$, which is generally the case.

Figure 2A:
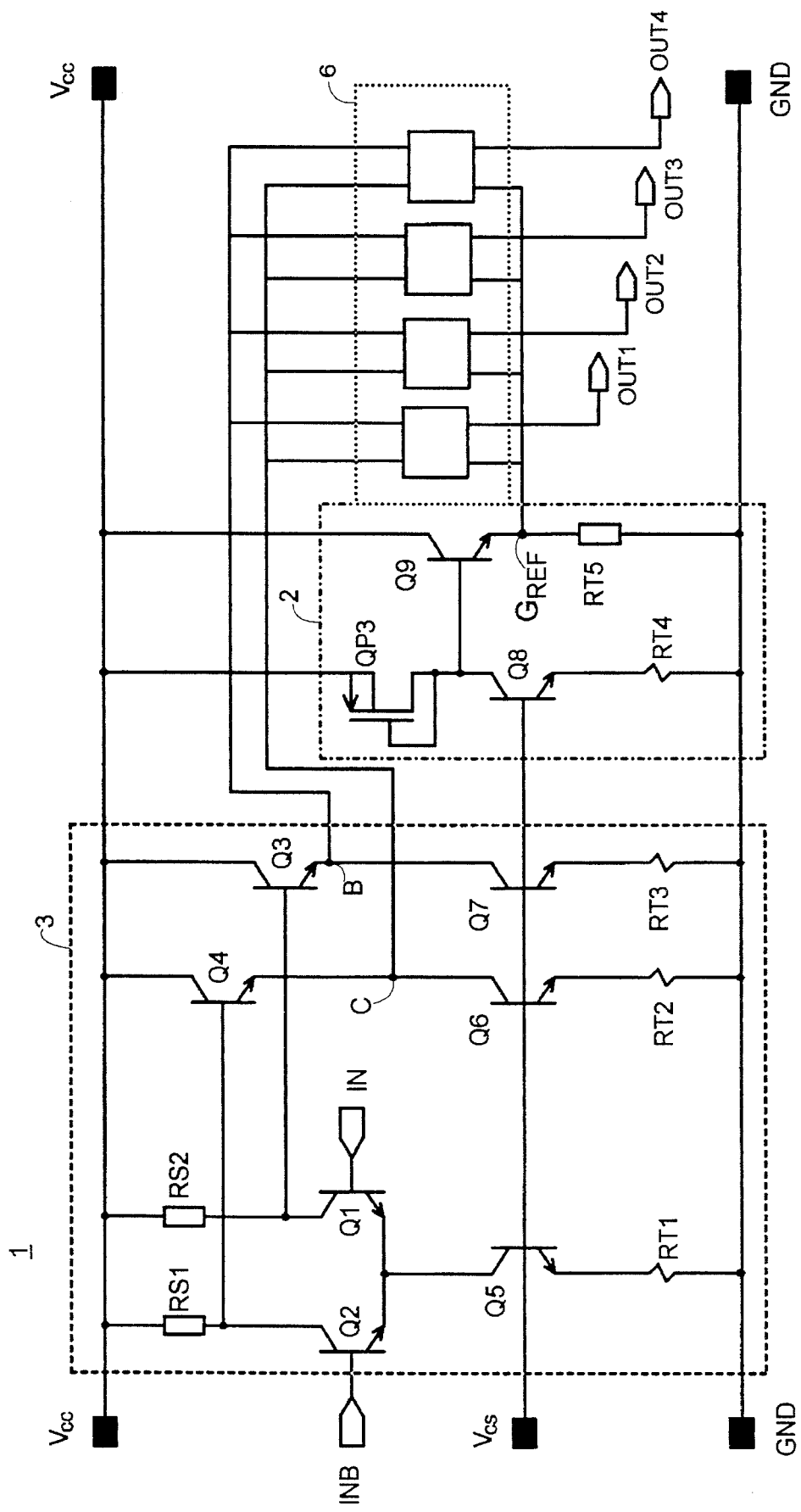
FIG. 2A is a simplified schematic diagram of the present invention, showing the reference voltage stage coupled to a plurality of fan-out stages.

Of course, in order to activate QP1 and QP2, it is necessary to provide input at the control nodes of those two PMOS transistors at sufficient voltage levels so as to turn them on (or off if required). Means for providing a reference voltage, $V_{REF}$, to those control nodes at levels suitable for MOS transistor operation, and at switching speeds compatible with ECL operations, is the key feature of the present invention. Specifically, $V_{REF}$ is provided in the circuit illustrated in FIG. 2 via the reference voltage stage 2. In the preferred embodiment of the present invention, the reference voltage stage 2 includes a reference transistor QP3 coupled between $V_{CC}$ and GND through a fourth current regulator, identified as Q8,RT4, operating in the same fashion and coupled to $V_{CS}$ as outlined for the other current-regulating transistors. The control node of the reference transistor QP3 is tied to the drain node of QP3 so that QP3 is always on, QP3 having a source-to-drain voltage drop identified as $V_{SDQP3}$. The drain node of the reference transistor QP3 is coupled to a control node of a bipolar reference transistor Q9, wherein Q9 is in an emitter-follower configuration. It is to be understood that Q9 can be sized to perform as required to provide a current source compatible with the requirements of the CMOS-output stage 4 of the present invention. In addition, a plurality of transistors may be tasked to perform that current-sourcing function. As is common with similar circuits, a fifth tail resistor RT5 provides a load to Q9 and is coupled between the emitter of Q9 and GND. As previously indicated, providing a bipolar reference transistor in this stage reduces switching-noise sensitivity in that any noise fluctuations at the emitter node of Q9 will either be pulled immediately up or down away from the node by Q9. Bipolar transistor Q9 also provides much lower impedance than a FET transistor would, thus permitting the use of the single reference voltage stage 2 to drive more current, or for a plurality of fanout loads, as illustrated in FIG. 2A, with fanout loads 6 each representing a CMOS-output stage such as CMOS-output stage 4.

The emitter of transistor Q9 is also coupled to a control node, or control nodes, of at least one output stage, including the CMOS output stage of the circuit illustrated in FIG. 2. The voltage drop across Q9 is identified as $V_{BEQ9}$. Therefore, the output voltage $V_{REF}$ for the reference voltage stage described herein is equivalent to $V_{CC}-V_{SDQP3}-V_{BEQ9}$. It is to be noted that Q9 must be sized to provide a current path from QP1 and QP2 as required in order to minimize noise effects from the sources of those two transistors. It has been determined that a bipolar transistor designed to operate at 75 microamps/per square micron of active emitter area will provide optimal current sourcing for the MOS transistors sized as noted hereinbelow. Of course, the size of Q9 can be varied, provided back-up and excessive current draw are avoided.

Now turning back to the example wherein input signal IN is at H, a reference gate node $G_{REF}$ of the reference-voltage stage 2 defines the link between the emitter node of Q9 and the control nodes of QP1 and QP2. Through this link, a source-to-gate voltage is developed on the first PMOS transistor QP1 equivalent to $(V_{CC}-V_{BEQ4})-(V_{CC}-V_{SDQP3}-V_{BEQ9})$. Preferably, the second emitter-follower transistor Q4 and reference emitter-follower stage Q9 are sized to be essentially identical so that the source-to-gate voltage across first PMOS transistor QP1 is $V_{SDQP3}$, which is sufficient to provide current through QP1 proportional to the size ratio of QP1 and QP3. At the same time, the source-to-gate voltage developed on the second PMOS transistor QP2 is equivalent to $(V_{CC}-V_{SWING}-V_{BEQ4})-(V_{CC}-V_{SDQP3}-V_{BEQ9})$. Therefore to make the ECL-to-CMOS translator circuit described herein operable, $V_{SWING}$ must be set so that it is essentially equal to the voltage drop $V_{SDQP3}$. This may be achieved by modulating the resistance value for tail resistor RT1, by modulating the resistance values for swing resistors RS1 and RS2, or by modulating both the tail resistor and the swing resistors. Alternatively, $V_{SWING}$ may first be set and then the size of QP3 set so that $V_{SDQP3}$ is essentially equal to $V_{SWING}$. The value of this $V_{SDQP3}$-matching-$V_{SWING}$ voltage must be limited so that neither Q1 nor Q2 is pushed into saturation, so as to avoid an unacceptably slow ECL stage. The threshold for this is generally a $V_{SWING}$ of about 2.0 V; a level that results in a base node voltage higher than the collector node voltage. Such a swing would indicate a current through QP3 of about 10 mA. In addition, QP3 must be sized so as to ensure operation of the reference-voltage stage 2, in that $V_{REF}$ must have a value suitable to turn on QP1 or QP2 when required, and to provide sufficient potential differential between the source and control nodes of those two MOS transistors. In one embodiment of the invention, QP3 is 160 microns wide, $V_{SDQP3}$-matching-$V_{SWING}$ voltage is about 0.8 V, and QP3 has a 1 mA current flowing through it. It is to be understood that QP3 can be varied in order to vary the propagation delay of the ECL-to-CMOS translator 1, with a minimum width of about six microns, i.e., when $V_{SDQP3}$ nears about 0.8 V.

Continuing the example wherein input signal IN is at H, the translation from bipolar logic levels to MOS logic levels can be seen. Specifically, when $V_{SDQP3}$ equals $V_{SWING}$ the voltage at the gate of QP2 is zero and QP2 is off. As noted, the current through QP1 is proportional to the size ratio of QP1 and QP3. For example, with QP3 sized at 160 microns wide and having a 1 mA current through it, a QP1 sized at 320 microns wide would have a current of 2 mA through it. It can thus be seen that varying the size of QP1, as well as that of QP2, will vary the current available as well as the rate of switching, to the extent that the increased size affects that rate. The current through QP1 is mirrored into QN2 via QN1 thus pulling node A to ground, or logic low for MOS circuits. Using the example where input signal IN is at L, translation to logic signal H for MOS circuits can be seen. If input signal IN is a logic signal L, the logical opposite of the input applied in the example discussed above, the collector voltages of Q1 and Q2 will swap and QP1 will be off. Hence, QN2 will also be off. A source-to-gate voltage equal to $V_{SDQP3}$ will develop on QP2, providing a current through node A proportional to the size ratio of QP2 and QP3, with the variations noted for QP1 size changes also available for QP2. Node A will then reach a logic high level equal to $V_{CC}-V_{BEQ4}$. Note that the translated signal at node A is the inverse of input signal IN, i.e. a bipolar logic level H is translated to a MOS logic level L. Hence, in the preferred embodiment an inverter 5 is coupled to node A so that all inputs and outputs of the ECL-to-CMOS translator 1 correspond. It is to be understood, however, that any load suitable for CMOS operation can be placed at the location shown, inverter 5 is provided solely for purposes of illustration. In addition, the circuit can be non-inverting rather than inverting, and it is to be noted that such inversion can take place at other locations of the translation circuit, including at the input of Q1 and Q2, at the collectors of Q1 and Q2, or at the emitters of Q3 and Q4.

QN1 and QN2, like QP1 and QP2, can be tailored to meet specific propagation delays and output strength requirements. Specifically, since it can be seen that QN1 sets the current that QN2 can discharge to GND, QN1 can be sized to regulate that discharge. For example, a doubling of the size of QN1 will double the discharge capability of QN2, and so on.

Figure 3:
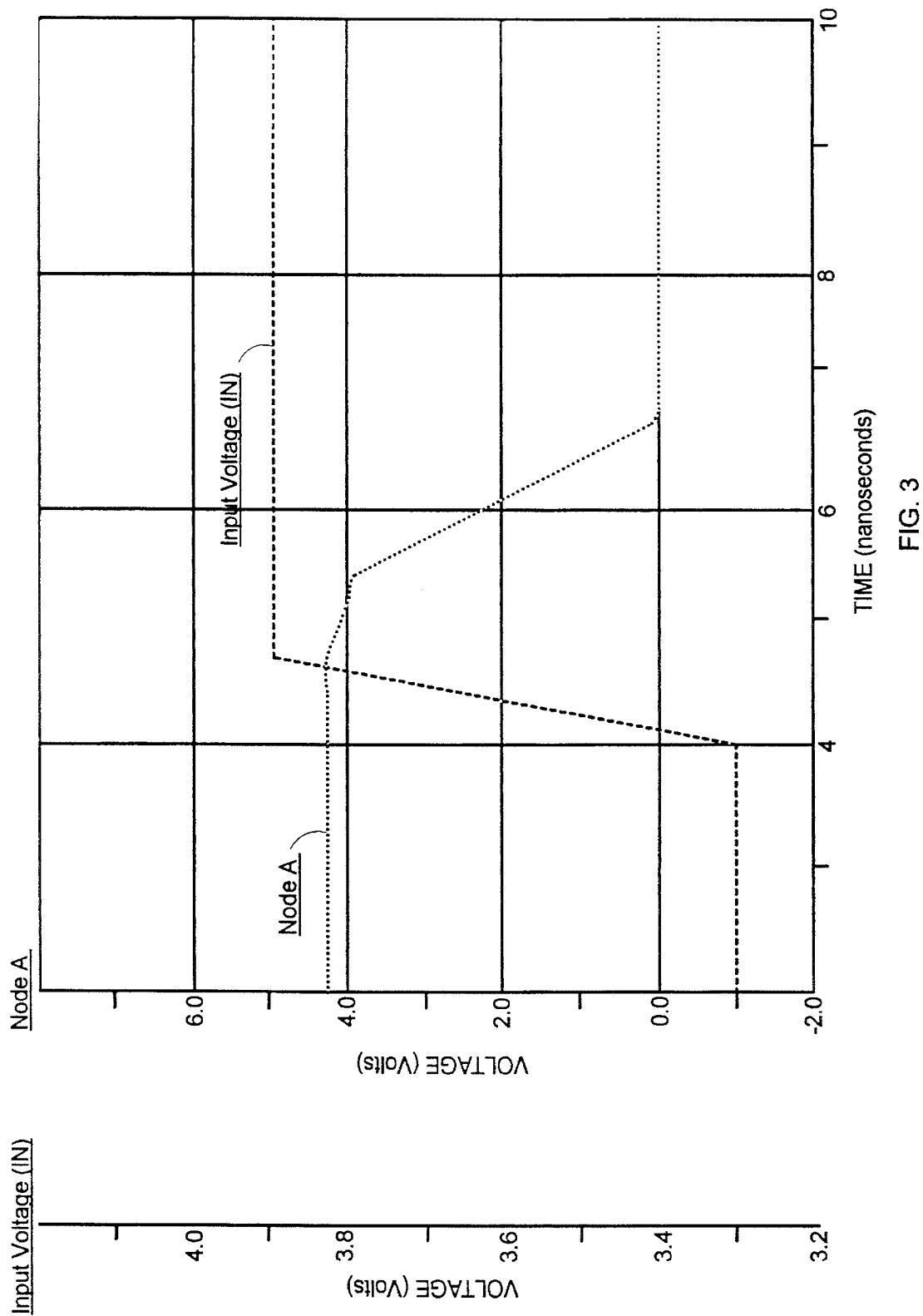
FIG. 3 is a graph of the propagation delay associated with the translator illustrated in FIG. 2 and described in the preferred embodiment of the present invention.

Through the invention described herein, the logic level swing associated with an externally-coupled ECL stage—on the order of about 0.8 V—can be translated into a swing ranging between $V_{CC}-V_{BEQ4}$ and GND—large enough and within the right range to meet the requirements of CMOS logic level switches. As a result, the collapsed voltage swings associated with ECL logic-levels—even as low as 0.4 V—can rapidly be translated to the much greater swings associated with MOS stages. FIG. 3 provides an illustration of the propagation delay improvement provided by the circuit of the present invention. In FIG. 3 it can be seen that for the transition at input IN from L→H, the propagation delay in the switch at node A from H→L is about 1.8 nanoseconds—much faster than similar prior-art devices having propagation delays of about 3.3 nanoseconds. As noted, the delay rates, as well as the output levels, can be adjusted as a function of adjustments in the dimensions of the output and reference stage transistors. Through variations in output levels available, the translator of the present invention can be used to provide fan out for as many as eight output stages from one reference stage of the design type illustrated by reference-voltage stage 2, wherein additional output stages can be coupled to additional input stages at, for example, nodes such as nodes B and C.

As previously noted, the translator 1 of the present invention may be used in particular applications, such as, for example, phase-lock-loop systems and clock recovery circuits. In that regard, the base of fourth current regulator transistor Q8 would be coupled to a loop filter rather than to $V_{CS}$, so that the current through 08 is modulated rather than constant. As a result, the tuned delay provided by the reference-voltage stage 2 can itself be modulated as a function of the tuning of the frequency associated with the loop filter. These and other applications of the tunable delay provided by the present translator can be readily observed by those skilled in the art.

Although the preferred embodiment of the present invention has been described herein, the above description is merely illustrative. Further modification of the invention herein disclosed will occur to those skilled in the respective arts and all such modifications are deemed to be within the scope of the invention as defined by the appended claims.

What is claimed is:

1. A translator circuit for translating from a first logic-level range to a second logic-level range, said translator circuit comprising:
   (a) an input stage having a first input transistor for receiving a first input signal and a second input transistor for receiving a second input signal which is the complement of said first input signal, wherein said first input transistor and said second input transistor are coupled to a high-potential power rail;
   (b) an output stage having a first output transistor coupled to a second output transistor and a third output transistor coupled to a fourth output transistor, wherein said output stage is a CMOS output stage and said first output transistor and said third output transistors are PMOS transistors, and said second output transistor and said fourth output transistor are NMOS transistors, wherein said first output transistor is coupled to said high-potential power rail and to said first input transistor, wherein said second output transistor is coupled to a low-potential power rail and to said fourth output transistor, wherein said third output transistor is coupled to said high-potential power rail and to said second input transistor and wherein said fourth output transistor is coupled to said low-potential power rail; and
   (c) a reference stage including: (i) a first reference transistor, wherein said first reference transistor is a PMOS transistor, wherein a source node of said first reference transistor is coupled to said high-potential power rail, wherein a gate node of said first reference transistor is coupled to a drain node of said first reference transistor and wherein a drain node of said first reference transistor is coupled to a low-potential power rail through a bipolar regulating transistor of a first current regulator; and (ii) a second reference transistor wherein said second reference transistor is a bipolar transistor having a collector node coupled to said high potential power rail, a base node coupled to said drain node of said first reference transistor, and an emitter node coupled to a gate node of said first output transistor and a gate node of said third output transistor.

2. The translator circuit as claimed in claim 1 wherein said reference stage and said input stage are coupled to an independent reference voltage source.

3. An ECL-to-CMOS translator circuit for translating from an ECL logic-level range to a CMOS logic-level range, said translator circuit comprising:
   (a) an ECL input stage having an input transistor and a complimentary-input transistor wherein a collector node of said input transistor is coupled to a first flow-through transistor and to a high-potential power rail through a first swing resistor and a collector node of said complimentary-input transistor is coupled to a second flow-through transistor and to said high-potential power rail through a second swing resistor and wherein an emitter node of said input transistor is couple to an emitter node of said complimentary-input transistor;
   (b) a CMOS output stage comprising:
      i. a first pair of MOS transistors including a first PMOS transistor and a first NMOS transistor, wherein a source node of said first PMOS transistor is coupled to said high-potential power rail through said first-flow through transistor, wherein a drain node of said first PMOS transistor is coupled to a gate node and to a drain node of said first NMOS transistor, and wherein a source node of said first NMOS transistor is coupled to a low-potential power rail; and
      ii. a second pair of MOS transistors including a second PMOS transistor and a second NMOS transistor, wherein a source node of said second PMOS transistor is coupled to said high-potential rail through said second-flow through transistor, wherein a drain node of said second PMOS transistor is coupled to a drain node of said second NMOS transistor, wherein a source node of said second NMOS transistor is coupled to said low-potential power rail, and wherein a gate node of said second NMOS transistor is coupled to said drain node of said first PMOS transistor and to said gate node of said first NMOS transistor; and (c) a reference-voltage stage having;
   i. a MOS reference transistor including a source node coupled to said high-potential power rail, a drain node coupled to said low-potential power rail through a first current regulator, and a gate node coupled to said drain node; and
   ii. a first bipolar reference transistor including a collector node coupled to said high-potential power rail, a base node coupled to said drain node of said MOS reference transistor, and an emitter node coupled to said low-potential power rail through a second current regulator, said emitter node further coupled to a gate node of said first PMOS transistor and to a gate node of said second PMOS transistor.

4. The ECL-to-CMOS translator as claimed in claim 3 wherein said first current regulator includes a second bipolar reference transistor having a collector node coupled to said drain of said MOS reference transistor and an emitter node coupled through a reference resistor to said low-potential power rail.

5. The translator circuit as claimed in claim 3 wherein said MOS reference transistor is a PMOS transistor fabricated to maximize current therethrough and to minimize the width of said PMOS transistor.

6. The translator circuit as claimed in claim 4, said ECL input stage further comprising:

(a) a first emitter-biased transistor, wherein a collector node of said first emitter-biased transistor is coupled to an emitter node of said first flow-through transistor and an emitter node of said first emitter-biased transistor is coupled to said low-potential power rail through a first emitter-biased resistor;

(b) a second emitter-biased transistor, wherein a collector node of said second emitter-biased transistor is coupled to an emitter node of said second flow-through transistor and an emitter node of said second emitter-biased transistor is coupled to said low-potential power rail through a second emitter-biased resistor; and (c) a third emitter-biased transistor, wherein a collector node of said third emitter biased transistor is coupled to an emitter node of said input transistor and to an emitter node of said complimentary-input transistor, and an emitter node of said third emitter-biased transistor is coupled to said low-potential power rail through a third emitter-biased resistor.

7. The ECL-to-CMOS translator circuit as claimed in claim 3 wherein a plurality of fan-out CMOS stages are coupled in parallel with said CMOS output stage.

* * * * *